United States Patent
Shibata et al.

(10) Patent No.: US 7,521,697 B2
(45) Date of Patent: Apr. 21, 2009

(54) METHOD FOR FABRICATING SEMICONDUCTOR DEVICE AND EQUIPMENT FOR FABRICATING THE SAME

(75) Inventors: Takeshi Shibata, Ibaraki-ken (JP); Kyoichi Suguro, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 76 days.

(21) Appl. No.: 11/890,485

(22) Filed: Aug. 7, 2007

(65) Prior Publication Data

US 2007/0295918 A1 Dec. 27, 2007

Related U.S. Application Data

(62) Division of application No. 10/743,290, filed on Dec. 23, 2003, now Pat. No. 7,267,927.

(30) Foreign Application Priority Data

Dec. 26, 2002 (JP) ............................ P2002-375978

(51) Int. Cl.
*A61N 5/00* (2006.01)
*G21G 5/00* (2006.01)

(52) U.S. Cl. .............. 250/492.1; 250/492.2; 250/492.3; 250/492.23; 250/311; 250/491.1; 250/492.22; 250/396 R; 257/500; 257/501; 257/E21.346; 257/E21.023; 216/45; 430/296; 430/311; 430/842; 430/5; 430/30; 430/22; 237/435; 237/618; 438/5; 438/514; 438/795; 355/18; 355/53

(58) Field of Classification Search .............. 250/492.1, 250/492.2, 492.3, 492.23, 311, 491.1, 492.22, 250/396 R; 257/500, 501, E21.346, E21.023; 216/45; 430/296, 311, 942, 5, 30, 22; 237/435, 237/618; 438/5, 514, 795; 355/18, 53
See application file for complete search history.

(56) References Cited

U.S. PATENT DOCUMENTS

| | | | |
|---|---|---|---|
| 6,770,402 B2 | 8/2004 | Suguro et al. | |
| 7,094,612 B2 | 8/2006 | Shibata et al. | |
| 7,267,927 B2 * | 9/2007 | Shibata et al. | .............. 430/296 |
| 2002/0058400 A1 | 5/2002 | Suguro et al. | |

FOREIGN PATENT DOCUMENTS

| | | |
|---|---|---|
| JP | 7-153657 | 6/1995 |
| JP | 2002-203806 A | 7/2002 |

* cited by examiner

*Primary Examiner*—Jack I Berman
*Assistant Examiner*—Meenakshi S Sahu
(74) *Attorney, Agent, or Firm*—Finnegan, Henderson, Farabow, Garrett & Dunner, L.L.P.

(57) ABSTRACT

A method for fabricating a semiconductor device and an equipment for fabricating the semiconductor device are described.

According to the method and the equipment, a semiconductor substrate is irradiated with a particle beam through an opening formed in a thin film portion of a stencil mask having the thin film portion and a supporting portion supporting the thin film portion. The method and the equipment are controlled so that the supporting portion of the stencil mask can be irradiated with the fringe of the particle beam. As a result, the method and the equipment provide suppressing deterioration such as deformation or breakage of the stencil mask.

2 Claims, 18 Drawing Sheets

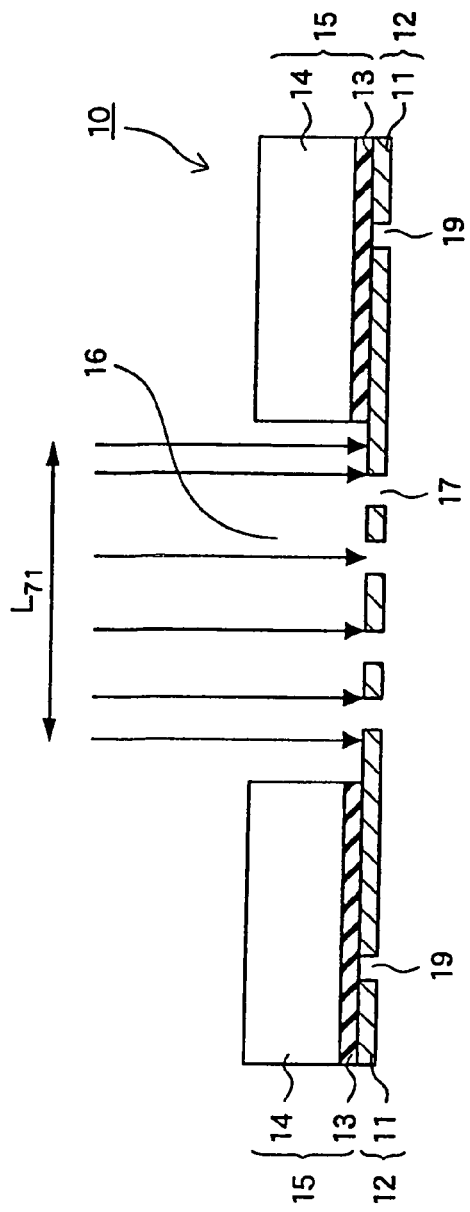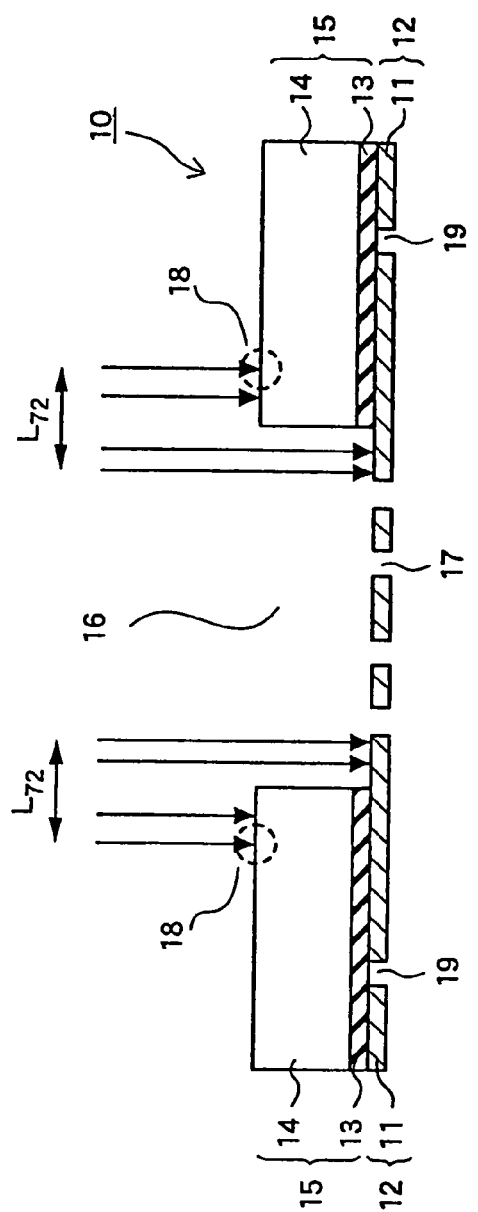

METHOD FOR FABRICATING SEMICONDUCTOR DEVICE AND EQUIPMENT FOR FABRICATING THE SAME

CROSS REFERENCE TO RELATED APPLICATION

This is a division of application Ser. No. 10/743,290, filed Dec. 23, 2003 now U.S. Pat. No. 7,267,927, which is incorporated herein by reference.

This application is based upon and claims the benefit of priority from the prior Japanese Patent Application No. 2002-375978, filed on December 26, the entire contents of which are incorporated herein by reference.

FIELD OF THE INVENTION

The present invention relates to a method for fabricating a semiconductor device and an equipment for fabricating the semiconductor device.

DESCRIPTION OF THE PRIOR ART

Recently, there have been used a method that semiconductor substrate is irradiated with a particle beam through an opening of a stencil mask in fabricating a semiconductor device. The stencil mask has opening patterns and is set above the semiconductor substrate in distance. A charged particle beam such as an electron and ion beam, a neutral particle beam such as an atom, molecule and neutron beam and an electromagnetic beam such as a photon or x-ray beam is used for the particle beam.

Japanese Patent Publication (Kokai) No. 2002-203806 discloses an ion-implantation process employing the stencil mask in fabricating a semiconductor device.

FIG. 15 and FIGS. 16A to 16C are a cross-sectional view and a schematic plane views, respectively, showing a main portion of the stencil mask. A pattern opening 121 of a stencil mask 120 is arranged right above the ion-implantation region of the semiconductor substrate (not illustrated). The semiconductor substrate is irradiated with ions through pattern opening 121. On the other hand, the non-opening portions in stencil mask 120 shields the non-ion-implantation regions of the semiconductor substrate.

Stencil mask 120 is formed with a thin film portion 123 made of a silicon thin film 122 and a support portion 126 made of a silicon oxide film 124 and a silicon supporting substrate 125. Pattern opening 121 of stencil mask 120 is covered with an irradiation region $L_9$.

A known equipment for fabricating the semiconductor device is shown in FIG. 17. A particle beam source 131 irradiated with a charged particle beam such as an ion as shown in FIG. 17. An irradiation region is maintained by using a scanner 132. A stencil mask 130 is irradiated with the charged particle beam through a scanner 132 and a collimator 133.

When stencil mask 130 is repeatedly used in the ion-implantation process, the particle beam collides to the non-opening region of stencil mask 130 repeatedly. As a result, damage such as a composition change or a structure change accumulates in the irradiated region of stencil mask 130. The irradiated region and the non-irradiated region are formed in thin film portion 123 of stencil mask 130 as shown in FIG. 18A.

The damage is accumulated in irradiated region of thin film portion 123. The stress is accumulated at a boundary 142 between damaged region and non-damaged region. As a result, there exists a problem that a stencil mask 130 is deformed as shown in FIG. 18B. Further accumulation of the damage causes breakage in thin film portion 123 of stencil mask 130 as shown in FIG. 18C.

In case that the particle beam dose is not uniformly introduced into thin film portion 123, the stress is accumulated at boundary between the more damaged region and the less damaged region. Accordingly, there exists a problem that the stencil mask is deformed and broken.

When the stencil mask is deformed, position displacement of the pattern opening occurs in the stencil mask. The predetermined region of the semiconductor substrate to be irradiated cannot be irradiated with the particle beam exactly. Accordingly, uniformity of the electrical characteristics is deteriorated or defect arises in the semiconductor devices used the stencil mask.

SUMMARY OF THE INVENTION

In order to improve the above-described problem, one aspect of the invention, there is provided a method for fabricating a semiconductor device, comprising preparing a stencil mask having a thin film portion with an opening and a support portion supporting the thin film portion, irradiating a semiconductor substrate with a particle beam through the opening, and controlling the particle beam, wherein the support portion is irradiated with a fringe portion of the particle beam.

Further, one aspect of the invention, there is provided a method for fabricating a semiconductor device, comprising preparing a stencil mask having a thin film portion with an opening and a support portion supporting the thin film portion, irradiating a semiconductor substrate with a particle beam through the opening and controlling the particle beam, wherein the support portion or the beam structure portion is irradiated with a fringe portion of the particle beam.

Further, one aspect of the invention, there is provided a method for fabricating a semiconductor device, comprising preparing a stencil mask having a thin film portion with an opening and a support portion supporting the thin film portion, irradiating a semiconductor substrate with a particle beam through the opening, and performing at least one process of beam irradiation, thermal annealing and chemical treatment to a region of the stencil mask, where is irradiated with the particle beam amount of which is smaller than that of the particle beam irradiating the other region of the stencil mask Further, one aspect of the invention, there is provided a equipment for fabricating a semiconductor device, comprising a particle beam source generating a particle beam to irradiate a semiconductor substrate with the particle beam through an opening of a stencil mask, the stencil mask having a thin film portion with the opening and a support portion supporting the thin film portion, a scanner scanning the particle beam, a mask measurement device measuring a position of a thin film portion or a supporting portion, and an arithmetic logic unit calculating the data measured by the mask measurement device and feeding back the results calculated with respect to at least one of the particle beam source and the scanner to control the region irradiated by the particle beam.

BRIEF DESCRIPTION OF THE DRAWINGS

FIGS. 14A and 14B are cross-sectional views showing the main portion of the stencil mask in a fifth embodiment of the present invention;

DETAILED DESCRIPTION OF THE INVENTION

Embodiments of the present invention will be described below in detail with reference to the drawings mentioned above.

A first embodiment of the invention is hereinafter explained using FIG. 1 to FIG. 4.

The first embodiment is a method employing a stencil mask without a beam structure portion for fabricating semiconductor device.

A semiconductor substrate is irradiated with a particle beam through an opening of the stencil mask set above the semiconductor substrate. A charged particle beam such as an electron or ion beam, a neutral particle beam such as an atom, molecule or neutron beam, or electromagnetic beam such as a photon or x-ray beam is used for the particle beam. However, the particle beam is not restricted to those beams.

Figure 1:
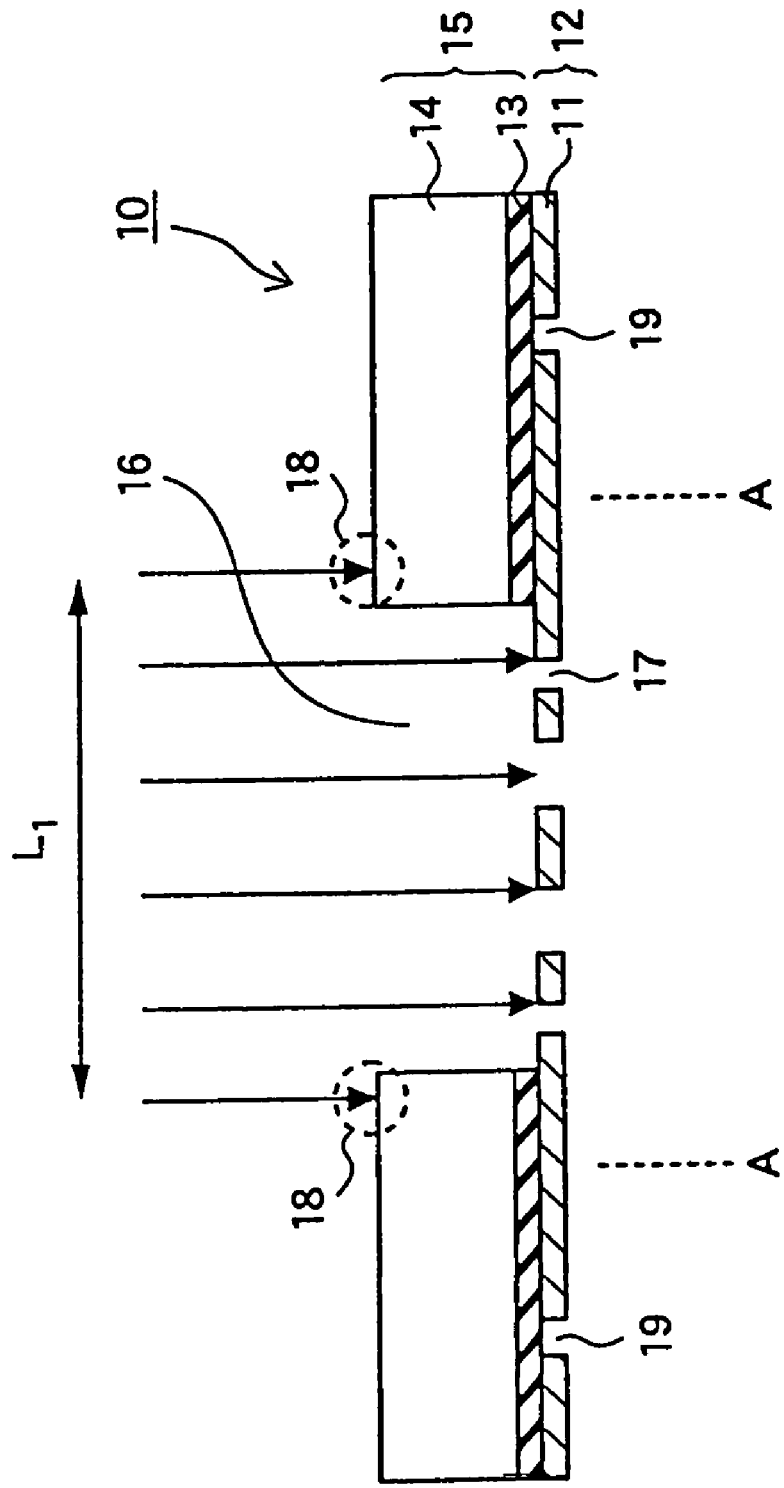
FIG. 1 is a cross-sectional view showing a main portion of a stencil mask in a first embodiment of the present invention.
Figure 2:
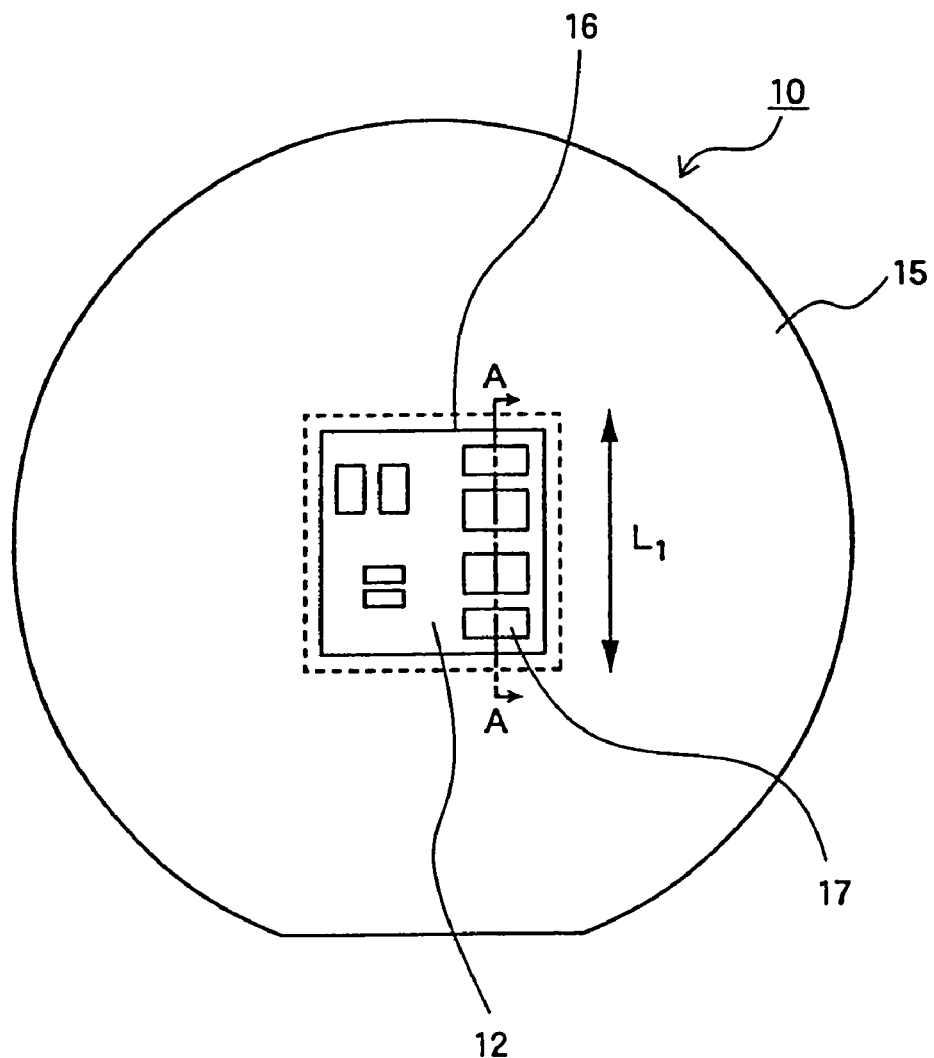
FIG. 2 is a schematic plane view showing the main portion of the stencil mask in the first embodiment of the present invention.

An ion-implantation process employing the stencil mask in fabricating semiconductor device is explained below. FIG. 1 and FIG. 2 are a cross-sectional view and a schematic plane view, respectively, showing a main portion of the stencil mask in the first embodiment of the invention. FIG. 1 shows enlarged cross sectional view taken along line A-A of FIG. 2. A pattern opening 17 of a stencil mask 10 is arranged right above the ion-implantation region of the semiconductor substrate (not illustrated). The semiconductor substrate is irradiated with ions through pattern opening 17. On the other hand, the non-opening portions in stencil mask 10 shield the non-ion-implantation region in the semiconductor substrate.

Stencil mask 10 is formed with a thin film portion 12 made of a silicon thin film 11 and a support portion 15 made of a silicon oxide film 13 and a silicon supporting substrate 14. A supporting-substrate opening 16 is formed in support portion 15. Pattern opening 17 of stencil mask 10 formed in silicon thin film 11 is covered with an irradiation region $L_1$ of stencil mask 10. A boundary 18 between the irradiated region and the non-irradiated region is formed on silicon supporting substrate 14, and is not formed on thin film portion 12.

An alignment mark 19 used for fabricating stencil mask 10 is shaped in silicon thin film 11 formed beneath support portion 15.

Figure 3A:
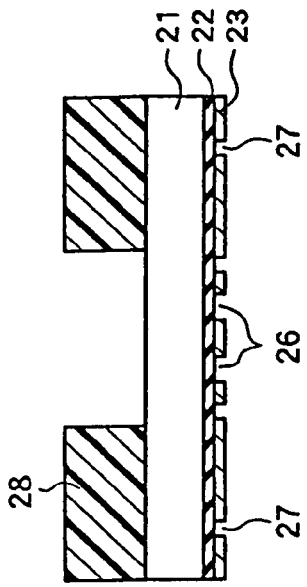
FIGS. 3A to 3F are cross-sectional views showing a method for fabricating the stencil mask in the first embodiment of the present invention.

A method for fabricating stencil mask 10 is shown in FIGS. 3A to 3F. A silicon oxide film 22 is formed on silicon supporting substrate 21 by thermal oxidation or CVD as shown in FIG. 3A. A thickness of silicon oxide film 22 is ranged from approximately 100 nm to 1 μm, while a thickness of silicon supporting substrate 21a is ranged from approximately 500 to 750 μm. A silicon substrate (not illustrated) is stacked on silicon oxide film 22, thus causing chemically bonding between the silicon substrate and silicon oxide film 22. By polishing the silicon substrate, a silicon thin film 23 with a thickness ranged from approximately 1 to 10 μm is obtained.

Figure 3B:
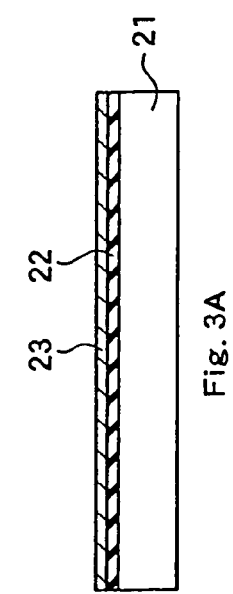

A resist film (not illustrated) is coated on silicon thin film 23, and is selectively delineated by using lithography. Consequently, a resist pattern 24 is formed on silicon thin film 23 as shown in FIG. 3B. An Insulating film such as a silicon oxide film may be formed for an underlying layer of resist pattern 24, and the insulating film pattern may be further formed by using resist pattern 24 as a mask.

Figure 3C:
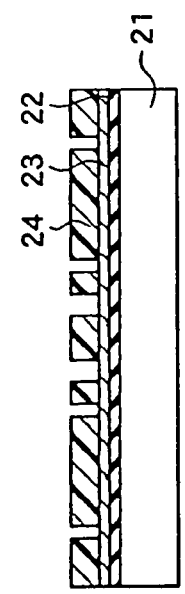

As shown in FIG. 3C, silicon thin film 23 is etched for resist pattern 24 as a mask by using dry etching. As a result, a pattern opening 26 and alignment mark 27 of stencil mask 10 are formed.

Figure 3D:
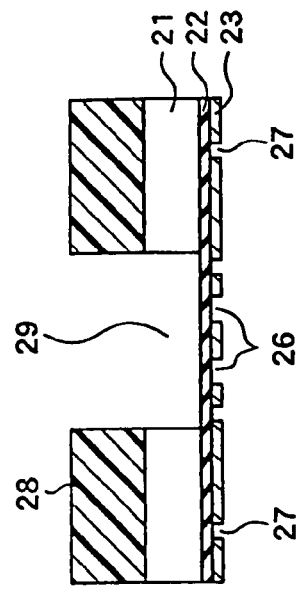

Resist pattern 24 is finally removed. A resist film (not illustrated) is coated on the back surface of silicon supporting substrate 21 and is selectively delineated. As a result, a resist pattern 28 is formed on the back surface of silicon supporting substrate 21 as shown in FIG. 3D. In the step mentioned above, alignment mark 27 shaped in silicon thin film 23 is used as a mark for the mask alignment.

Figure 3E:
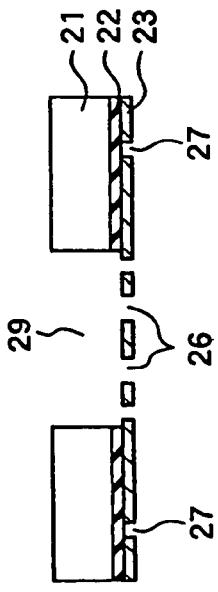
Figure 3F:
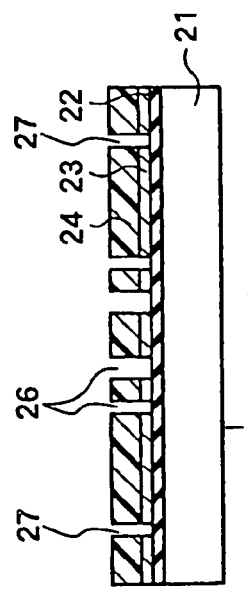

As shown in FIG. 3E, wet etching using a solution such as KOH, or dry etching such as RIE is performed, consequently, a supporting-substrate opening 29 is formed in silicon supporting substrate 21. Silicon oxide film 22 and resist pattern 28 are finally removed as shown in FIG. 3F.

The patterns in stencil mask 10 thus obtained are formed in consideration of an alignment margin between the front surface and the back surface of silicon thin film 23. For example, in case that supporting-substrate opening 29 is mainly formed by using RIE, an alignment margin between the end of pattern opening 26 and supporting-substrate opening 29 is below approximately 100 μm length. Moreover, in case that supporting-substrate opening 29 is mainly formed by using solution such as KOH, a margin between the end of pattern opening 26 and supporting-substrate opening 29 is below approximately 500 μm length.

In this embodiment, pattern-opening 17 formed in silicon thin film 11 is sufficiently covered with the particle beam as shown in FIGS. 1 and 2. A boundary 18 between the irradiated region and the non-irradiated region is not formed on thin film portion 12. Moreover, the dose of the particle beam within irradiation region L1 is almost uniform. Therefore, degradation such as modification and breakage in thin film portion 12 formed in stencil mask 10 is controlled.

The fringe of the region introduced with the particle beam is formed on support portion 15. Boundary 18 between the damaged region and non-damaged region is formed on support portion 15, which is comparatively thicker than silicon thin film 23. Accordingly, degradation such as modification or breakage in the stencil mask used in steps fabricating a semiconductor device can be controlled.

In consideration that the stress change generated near boundary 18 causes modification and breakage of a stencil mask, it may be still necessary to form boundary 18 between the irradiation region and the non-irradiation region precisely.

During forming pattern-opening 17 in silicon thin film 11, alignment mark 19 is also shaped simultaneously. Therefore, alignment mark 19 is shaped accurately, and the mask alignment between the front surface and back surface in silicon thin film 11 is easily performed. Moreover, there is no additional step for fabricating stencil mask 10.

The method for fabricating stencil mask 10 as shown in FIGS. 3A to 3F is merely one example. Accordingly, a size of materials, a kind of solutions and the order of steps, etc. are not restricted. Moreover, alignment mark 19 is formed in silicon thin film 11 to perform the mask alignment between the front surface and the back surface. However, alignment mark 19 may be not formed. Alignment mark 19 is a groove or an opening. It is formed in a silicon thin film12 simultaneously during forming pattern opening 17, however formation of alignment mark 19 is not limited at the step in fabricating stencil mask 19. It may be formed before or after forming pattern-opening 17. Features of alignment mark 19 are not limited for crossing feature, dot feature, line form and the like.

Figure 4:
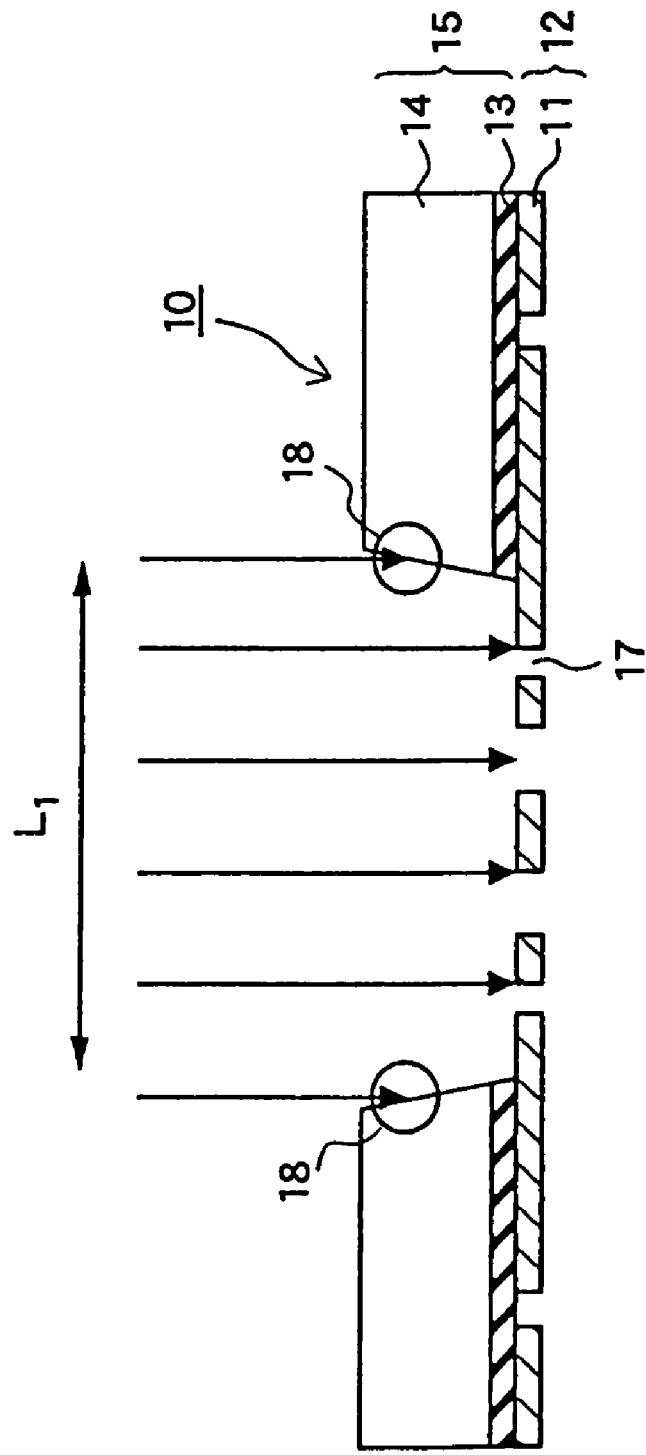
FIG. 4 is a cross-sectional view showing the main portion of the stencil mask in a second embodiment of the present invention.

Moreover, a sidewall of silicon supporting substrate 15 may be tapered. FIG. 4 is a cross-sectional view of the main portion of stencil mask 10. In this case, thin film portion 12 of stencil mask 10 is irradiated with the particle beam having uniform dose. Boundary 18 may be formed on tapered region of silicon supporting substrate 14, whose thickness is thicker than thin film portion 12.

A second embodiment of the invention is hereinafter explained using FIG. 5 to FIG. 7.

The second embodiment is a method employing a stencil with a plurality of beam structure portions on a thin silicon film for fabricating semiconductor device.

A semiconductor substrate is irradiated with particle beams through an opening of the stencil mask set above the semiconductor substrate. A charged particle beam such as an electron or ion beam, a neutral particle beam such as an atom, molecule or neutron beam, or electromagnetic beam such as a photon or x-ray beam are used for the particle beam. However, particle beam is not restricted to those beams.

An ion-implantation process employing the stencil mask in fabricating semiconductor device is explained below. FIG. 5 is a cross-sectional view showing a main portion of the stencil mask in the second embodiment of the invention. FIGS. 6A and 6B are schematic plane views of the stencil mask in the second embodiment of the invention. FIG. 5 shows enlarged cross sectional view taken along line B-B of FIGS. 6A and 6B.

A pattern opening 47 of a stencil mask 40 is arranged right above the ion-implanted region of the semiconductor substrate (not illustrated). Ions passed through pattern opening 47 are introduced into the semiconductor substrate. On the other hand, the non-opening portions in stencil mask 10 shield the non-ion-implantation regions in the semiconductor substrate.

Stencil mask 40 is formed with a thin film portion 42 made of a silicon thin film 41 and a support portion 45 made of a silicon oxide film 43 and a silicon supporting substrate 44. A supporting-substrate opening 46 is formed in support portion 45. A plurality of beam structure portions made of silicon supporting substrate 44, which are a first beam structure portion 45a and second beam structure portion 45b, are formed on a part of silicon thin film 41 formed in supporting-substrate opening 46.

Such beam structure portions 45a, 45b can be formed in correspondence with the patterns formed in stencil mask 40. Moreover, beam structure portions 45a, 45b can raise the strength of stencil mask 40. Pattern-opening 47 formed in silicon thin film 41 are located between first beam structure portion 45a and second beam structure portion 45b, first beam structure portion 45a and support portion 45, and second beam structure portion 45b and support portion 45.

Silicon thin film 41 between first beam structure portion 45a and second beam structure portion 45b is covered with an irradiation region L2. A boundary 48 between the irradiated region and the non-irradiated region is formed on beam structure portion 45a and 45b, and is not formed on thin film portion 42.

An alignment mark 49 used for fabricating stencil mask 40 is shaped in silicon thin film 41 formed beneath support portion 45.

Here $A_2$ is the width of a beam opening 46a, which is the length of thin film portion 42 between first beam structure portion 45a and second beam structure portion 45b. Moreover, $B_2$ and $C_2$ are the width of beam structure portion 45a, 45b, respectively. Irradiation region L2 of the particle beams becomes as follows, $$A_2 < L_2 < (A_2 + B_2 + C_2).$$

Since the method for fabricating stencil mask 40 is almost the same as the method for fabricating the stencil mask of the first embodiment as shown in FIGS. 3A to 3F, it is not explained here.

Figure 5:
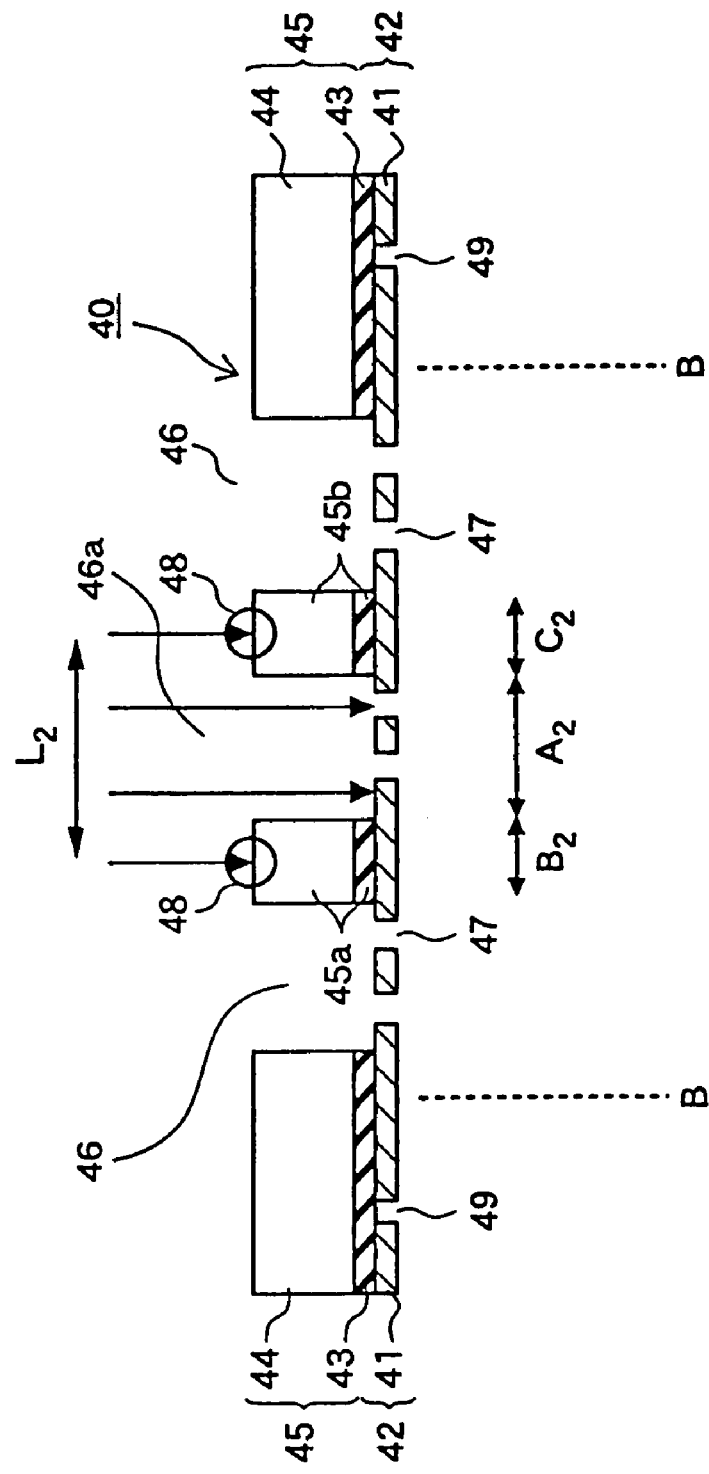
FIG. 5 is a cross-sectional view showing the main portion of the stencil mask in the second embodiment of the present invention.
Figure 6A:
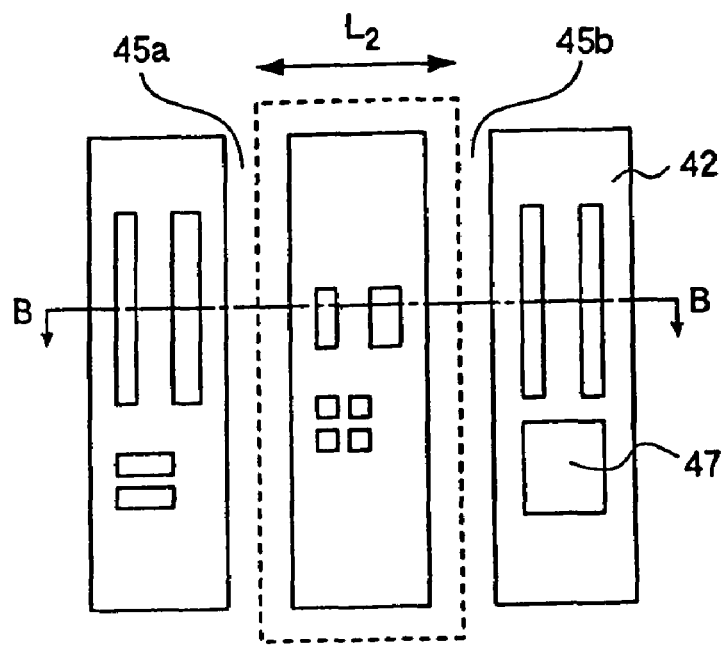
FIGS. 6A and 6B are schematic plane views showing the main portion of the stencil mask in the second embodiment of the present invention.
Figure 6B:
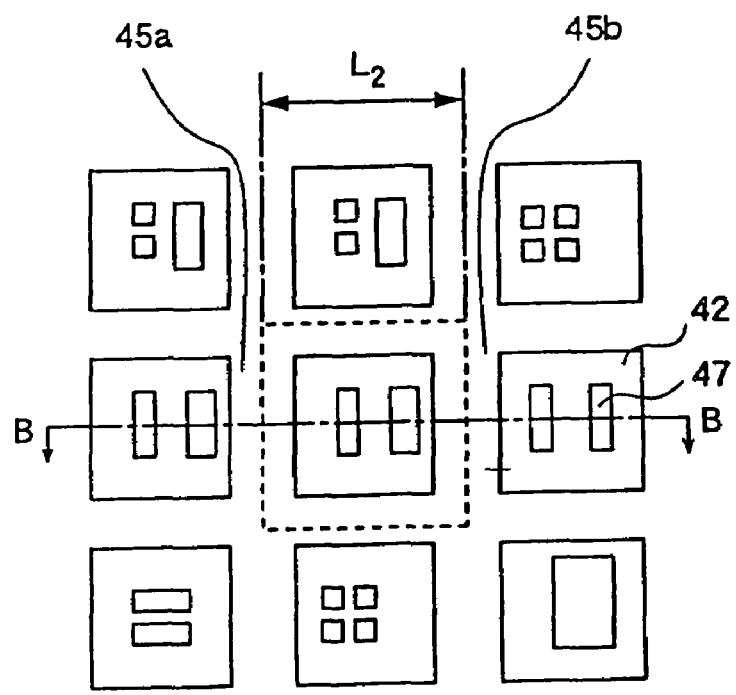
Figure 7:
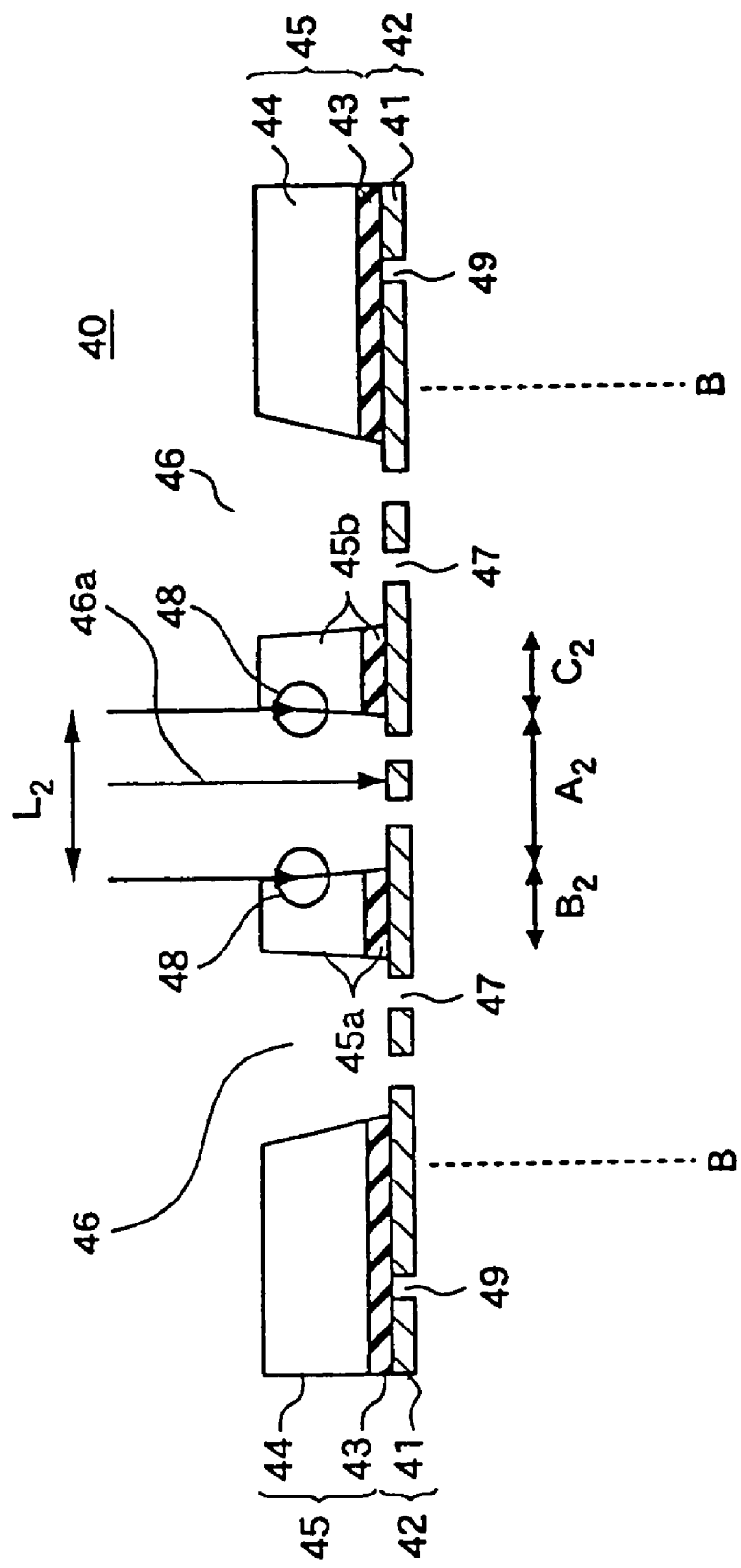
FIG. 7 is a cross-sectional view showing the main portion of the stencil mask in a modification of the second embodiment of the present invention.

In this embodiment, silicon thin film 41 formed between first beam structure portion 45a and second beam structure portion 45b is sufficiently covered with the particle beams as shown in FIG. 5, FIGS. 6A and 6B. A boundary 48 between the irradiated region and the non-irradiated region is not formed on thin film portion 42.

Therefore, degradation such as modification and breakage in thin film portion 42 formed in stencil mask 40 is controlled.

During forming pattern-opening 47 in silicon thin film 41, alignment mark 49 is also shaped simultaneously. Therefore, alignment mark 49 is shaped accurately, and the mask alignment between the front surface and back surface in silicon thin film 41 is easily performed. Moreover, there is no additional step for fabricating stencil mask 10.

The method for fabricating stencil mask 10 as shown in FIGS. 3A to 3F is merely one example. Accordingly, a size of materials, a kind of solutions and the order of steps, etc. are not restricted.

Moreover, alignment mark 49 is formed in silicon thin film 41 to perform the mask alignment between the front surface and the back surface. However, alignment mark 19 may be not formed.

In stencil mask 40 having beam structure portions, it is necessary to precisely align between the front surface and the back surface. Alignment mark 49 is effective to easily perform highly precise alignment between the front surface and the back surface.

Alignment mark 49 is a groove or an opening. It is formed in a silicon thin film 42 simultaneously during forming pattern opening 47, however formation of alignment mark 49 is not limited at the step in fabricating stencil mask 49. It may be formed before or after forming pattern-opening 47. Features of alignment mark 49 are not limited for crossing feature, dot feature, line form and the like.

Moreover, a sidewall of silicon supporting substrate 45 may be tapered. FIG. 7 is a sectional view of the main portion of stencil mask 40. In this case, thin film portion 42 of stencil mask 40 is irradiated with the particle beam having uniform dose. Boundary 48 may be formed on tapered region of silicon supporting substrate 44, whose thickness is thicker than thin film portion 42.

A first modification of the second embodiment in the invention is hereinafter explained using FIG. 8 and FIG. 9.

The first Modification is a method employing a stencil with four beam structure portions on a thin silicon film for fabricating semiconductor device.

A stencil mask 60 is formed with a thin film portion 62 made of a silicon thin film 61, and a support portion 65 made of a silicon oxide film 63 and a silicon supporting substrate 64. A supporting-substrate opening 66 is formed in support portion 65.

A plurality of beam structure portions made of silicon supporting substrate 64, which are a first beam structure portion 65a, a second beam structure portion 65b, a third beam structure portion 65c and a fourth beam structure portion 65d, are formed on a part of silicon thin film 61 formed in supporting-substrate opening 66. Such beam structure portions 65a, 65b, 65c, 65d can be formed in correspondence with the patterns formed in stencil mask 60. Moreover, the beam structure portions 65a, 65b, 65c, 65d can raise the strength of stencil mask 60.

Pattern opening 67 of stencil mask 60 shaped in silicon thin film 61 is located between first beam structure portion 65a and support portion 65, fourth beam structure portion 65d and support portion 65, and each of beam structure portions 65a, 65b, 65c, 65d.

In this modification, silicon thin film 61 between second beam structure portion 65b and fourth beam structure portion 65d covered with an irradiation region $L_3$. A boundary 68 between the irradiated region and the non-irradiated region is not formed on thin film portion 62. That is, all the regions of thin film portion 62 between second beam structure portion 65b and fourth beam structure portion 65d are irradiated with the particle beam.

An alignment mark 69 used for fabricating stencil mask 60 is shaped in silicon thin film 61 formed beneath support portion 65.

Here $A_3$ is the width of a beam opening 66a, which is the length of thin film portion 62 between second beam structure portion 65b and third beam structure portion 65c and between third beam structure portion 65c and fourth beam structure portion 65d. Moreover, $B_3$, $C_3$ and $D_3$ are the width of beam structure portions 65b, 65c, 65d, respectively. Irradiation region $L_3$ of the particle beam becomes as follows, $$2A_3+C_3<L_3<(2A_3+B_3+C_3+D_3).$$

Since the method of fabricating stencil mask 60 is almost the same as the method for fabricating the stencil mask of the first embodiment as shown in FIGS. 3A to 3F, it is not explained here.

Figure 8:
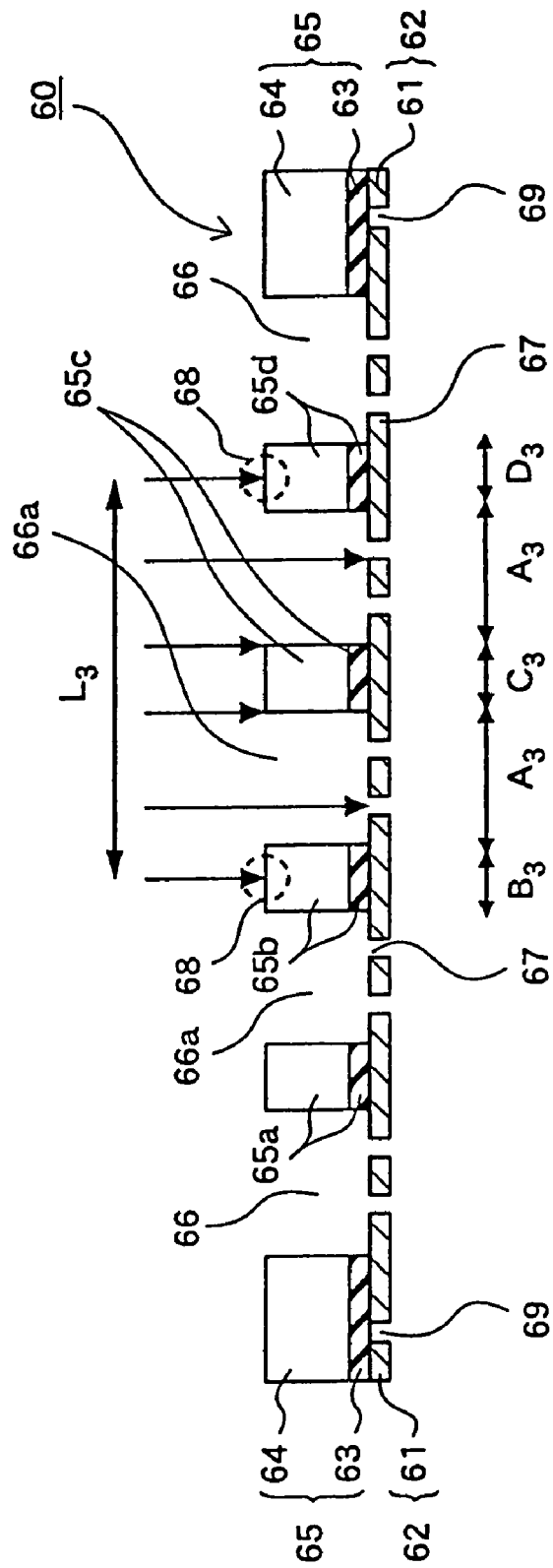
FIG. 8 is a cross-sectional view showing the main portion of the stencil mask in the modification of the second embodiment of the present invention.
Figure 9:
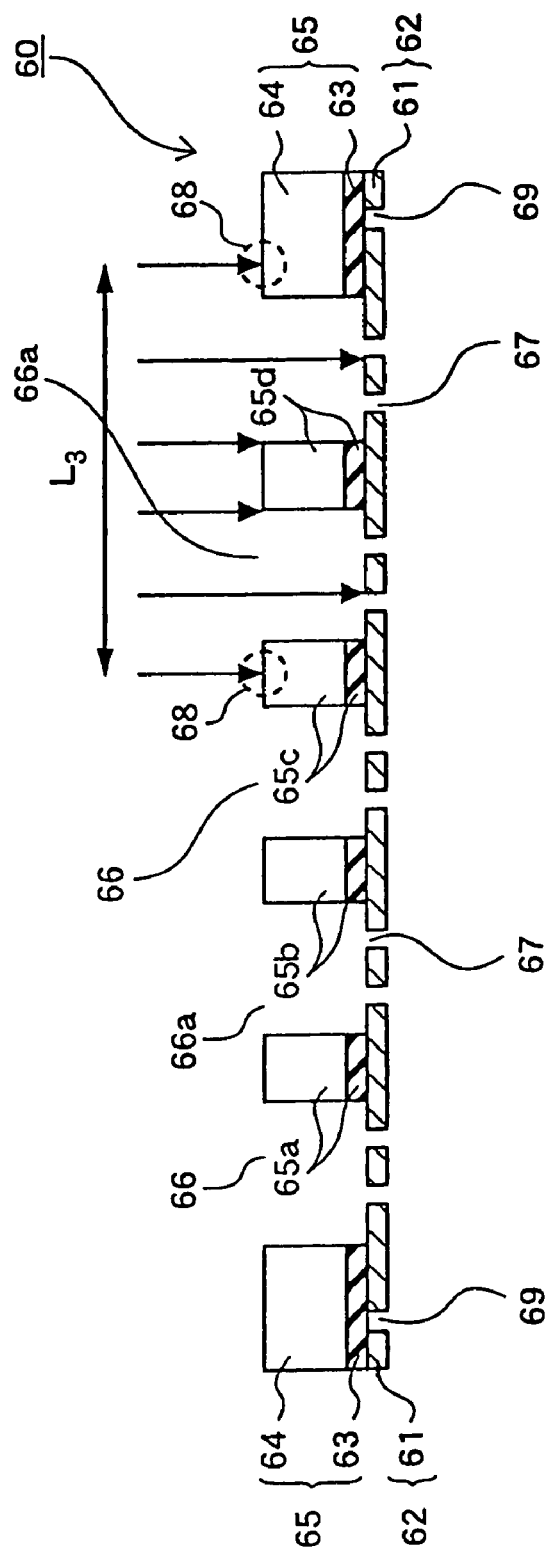
FIG. 9 is a cross-sectional view showing the main portion of the stencil mask in the modification of the second embodiment of the present invention.

In this modification, silicon thin film 61 formed between second beam structure portion 65b and fourth beam structure portion 65d is covered sufficiently with the particle beam as shown in FIG. 8. A boundary 68 between the irradiated region and the non-irradiated region is not formed on thin film portion 62. Moreover, the dose of the particle beam within irradiation region $L_3$ is almost uniform. Therefore, degradation such as modification and breakage in thin film portion 62 formed in stencil mask 60 is controlled.

Moreover, a sidewall of the silicon supporting substrate may be tapered (not illustrated). In this case, boundary 68 may be formed on tapered region of second beam structure portion 65b and fourth beam structure portion 65d, whose thickness is thicker than thin film portion.

This modification shows merely an example in which four beam structure portions are formed in the supporting-substrate opening. A number of beam structure portions are not limited to four pieces. One or more beam structure portions can be formed.

Furthermore, this modification shows an example in which boundary 68 between the damaged region and non-damaged region is formed on two beam structure portions, however the formation of the boundary is also not limited on the two beam structure portions. For example, a part of the boundary can be formed on the support portion and another part of the boundary can be formed on the beam structure portion as shown in FIG. 9. Moreover, a beam structure portion formed inside the irradiation region $L_3$ of a particle beam is shown for an example, however a number of the beam structure portions are not limited to one piece.

Figure 10:
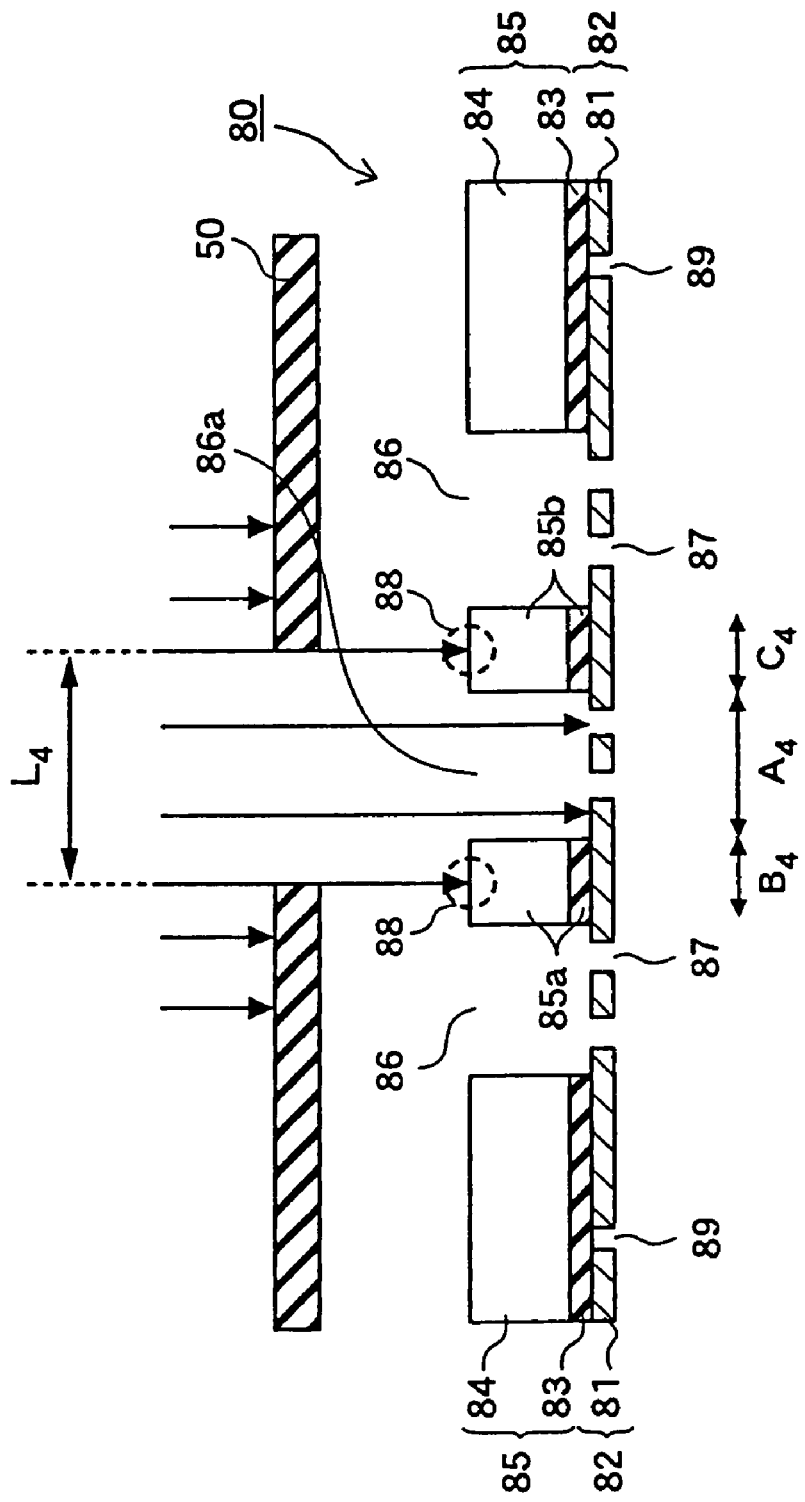
FIG. 10 is a cross-sectional view showing the main portion of the stencil mask in a third embodiment of the present invention.

A third embodiment of the invention is hereinafter explained using FIG. 10 to FIG. 12.

The third embodiment is a method employing a stencil mask above which an aperture is installed for fabricating semiconductor device.

A semiconductor substrate is irradiated with a particle beam through an opening of the stencil mask set above the semiconductor substrate. A charged particle beam such as an electron or ion beam, a neutral particle beam such as an atom, molecule or neutron beam, or an electromagnetic beam such as a photon or x-ray beam is used for the particle beam. However, the particle beam is not restricted to those beams.

An ion-implantation process employing the stencil mask in fabricating semiconductor device is explained below. FIG. 10 is a cross-sectional view showing the main portion of the stencil mask in the third embodiment of the invention.

A pattern opening 87 of a stencil mask 80 is arranged right above the ion-implanted region of the semiconductor substrate (not illustrated). The semiconductor substrate is irradiated with ions through pattern opening 87. On the other hand, the non-opening portions in stencil mask 80 shield the non-ion-implantation regions in the semiconductor substrate.

Stencil mask 80 is formed with a thin film portion 82 made of a silicon thin film 81 and a support portion 85 made of a silicon oxide film 83 and a silicon supporting substrate 84. A supporting-substrate opening 86 is formed in support portion 85.

A plurality of beam structure portions made of silicon supporting substrate 84, which are a first beam structure portion 85a and second beam structure portion 85b, is formed on a part of silicon thin film 81 formed in supporting substrate opening 86.

Such beam structure portions 85a, 85b can be formed in correspondence with the patterns formed in stencil mask 80. Moreover, the beam structure portions can raise the strength of the stencil mask 80.

Pattern opening 87 of stencil mask 80 formed in silicon thin film 81 is located between first beam structure portion 85a and second beam structure portion 85b, first beam structure portion 85a and support portion 85, and beam structure portion 85b and support portion 85.

In this embodiment, an aperture 50 made of silicon and the like is installed above stencil mask 80. Consequently, silicon thin film 81 between first beam structure portion 85a and second beam structure portion 85b is included in an irradiation region $L_4$ of stencil mask 80. A boundary 88 between the irradiated region and the non-irradiated region is not formed on thin film portion 82.

An alignment mark 89 used for fabricating stencil mask 80 is shaped in silicon thin film 81 formed beneath support portion 85.

Here, $A_4$ is the width of a beam opening 86a, which is the length of thin film portion 82 between first beam structure portion 85a and second beam structure portion 85b. Moreover, $B_4$ and $C_4$ are the width of first beam structure portion 85a and second beam structure portion 85b, respectively. Irradiation region $L_4$ of the particle beam becomes as follows, $$A_4 < L_4 < (A_4 + B_4 + C_4).$$

Since the method for fabricating stencil mask 80 is almost the same as the method for fabricating the stencil mask of the first embodiment as shown in FIGS. 3A to 3F, it is not explained here.

In this embodiment, pattern-opening 87 shaped in silicon thin film 81 is formed between first beam structure portion 85a and second beam structure portion 85b, first beam structure portion 85a and support portion 85, and beam structure portion 85b and support portion 85.

An aperture 50 made of silicon and the like is installed above stencil mask 80. Aperture 50 restricts irradiated region $L_4$, which covers silicon thin film 81 between first beam structure portion 85a and second beam structure portion 85b. Accordingly, boundary 88 between the damaged region and non-damaged region is not formed on thin film portion 82. That is, all the regions of thin film portion 82 between first beam structure portion 85a and second beam structure portion 85b are irradiated with the particle beam.

Here, the dose of the particle beam within thin film portion 82 of stencil mask 80 is almost uniform. Moreover, the dose of the particle beam may be uniform also in the depth of thin film portion 82 of a stencil mask 80.

As the fringe of a particle beam region is formed on beam structure portion 85a, 85b, the boundary between the damaged region and non-damaged region exists on beam structure portion 85a, 85b, which is comparatively thicker than thin silicon portion 82. Therefore, degradation of modification and breakage of stencil mask 80 is not generated by the induced stress in this region.

The area of silicon thin film 82 formed between first beam structure portion 85a and second beam structure portion 85b can be changed in a step of fabricating the semiconductor device in consideration of the design of the semiconductor equipment. Trimming or adjusting the irradiation region $L_4$ by using aperture 50 easily enables to be irradiated uniformly with the particle beam into thin film portion 82.

Therefore, degradation such as modification and breakage in thin film portion 82 formed in stencil mask 80 is controlled.

In consideration that the stress change generated near boundary 88 causes modification and breakage of a stencil mask, it may be still necessary in detail to form boundary 88 between the irradiated region and the non-irradiated region.

During forming pattern-opening 87 in silicon thin film 81, alignment mark 89 is also shaped simultaneously. Therefore, alignment mark 89 is shaped accurately, and the mask alignment between the front surface and back surface in silicon thin film 11 is easily performed. Moreover, there is no additional process fabricating stencil mask 80.

The method for fabricating the stencil mask as shown in FIGS. 3A to 3F is merely one example. Accordingly, a size of materials, a kind of solutions and the order of processes, etc. are not restricted.

Moreover, alignment mark 89 is formed in silicon thin film 81 to perform the mask alignment between the front surface and the back surface. However, alignment mark 89 may be not formed.

In stencil mask 80 having a beam structure portion, it is necessary to precisely align between the front surface and the back surface. Alignment mark 89 is effective to easily perform highly precise alignment between the front surface and the back surface.

Alignment mark 89 is a groove or an opening. It is formed in silicon thin film 82 simultaneously during forming pattern opening 87, however formation of alignment mark 89 is not limited at the step in fabricating stencil mask 89. It may be formed before or after forming pattern-opening 87. Features of alignment mark 89 are not limited for crossing feature, dot feature, line form and the like.

Moreover, a sidewall of the silicon supporting substrate 85 may be tapered. In this case, thin film portion 82 of a stencil mask 80 is irradiated with the particle beam having uniform dose. Boundary 88 may be formed on tapered region of silicon supporting substrate 84.

Figure 11:
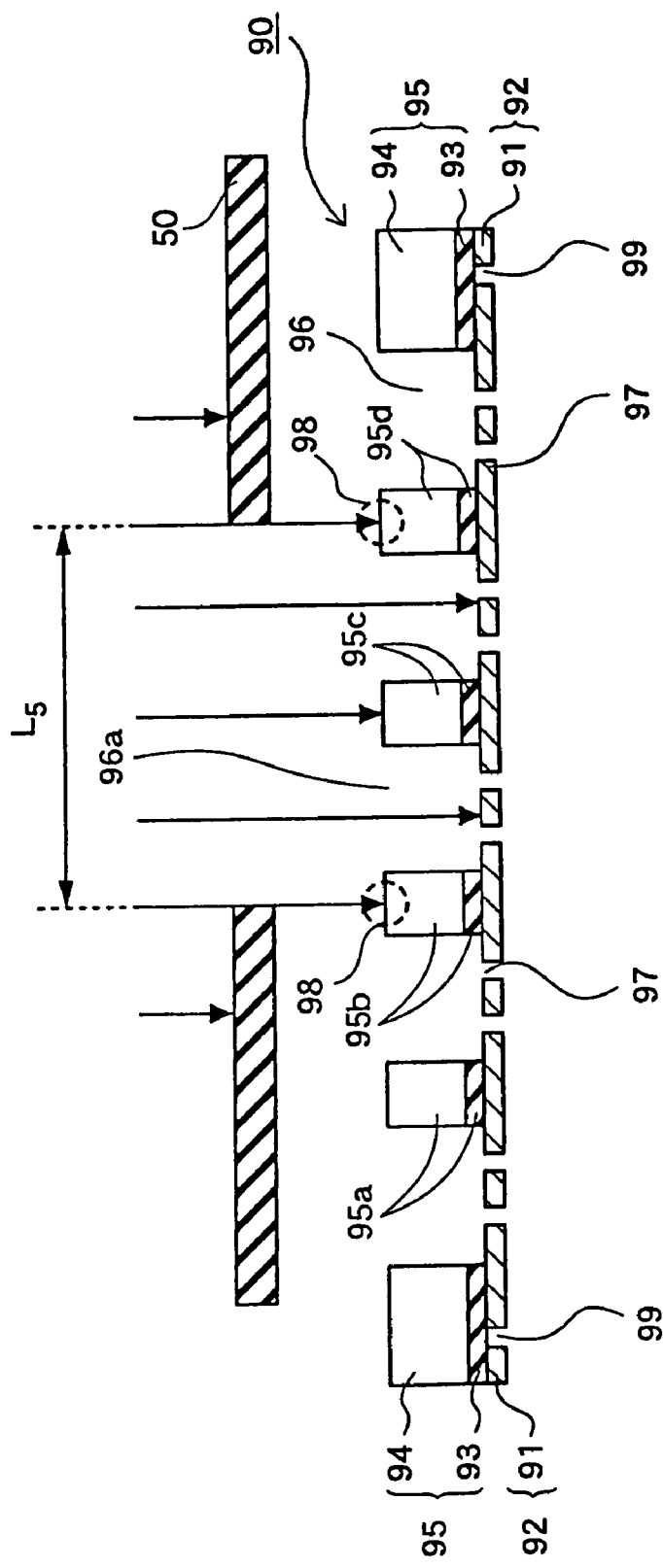
FIG. 11 is a cross-sectional view showing the main portion of the stencil mask in the third embodiment of the present invention.

As shown in FIG. 11, aperture50 in the third embodiment can also be applied to the method fabricating semiconductor device in the first modification of the second embodiment as shown in FIG. 8.

Pattern opening. 97 of stencil mask 90 shaped in silicon thin film 91 is located between support portion 95 and beam structure portion 95a, support portion 95 and beam structure portions 95d, and each of beam structure portions 95a, 95b, 95c, 95d. Aperture 50 made of silicon and the like is installed above stencil mask 90. Aperture 50 restricts irradiated region $L_5$, which covers silicon thin film 91 between second beam structure portion 95b and fourth beam structure portion 95d. A boundary 98 between the irradiated region and the non-irradiated region is not formed on thin film portion 92. That is, the region of thin film portion 92 between second beam structure portion 95b and fourth beam structure portion 95d is irradiated with the particle beam.

The area of silicon thin film 92 formed between second beam structure portion 95b and forth beam structure portion 95d can be changed in a step of fabricating the semiconductor device in consideration of the design of the semiconductor equipment. Adjusting the irradiation region $L_5$ by using aperture 50 easily enables to be irradiated uniformly with the particle beam into thin film portion 92.

Therefore, degradation such as modification and breakage in thin film portion 92 formed in stencil mask 90 is controlled. Moreover, a sidewall of beam opening 96 may be tapered. In this case, boundary 98 may be formed on tapered region of silicon supporting substrate 94. In this embodiment, it is probable to form irradiation region by using a plurality of apertures as shown in FIG. 12.

Figure 12:
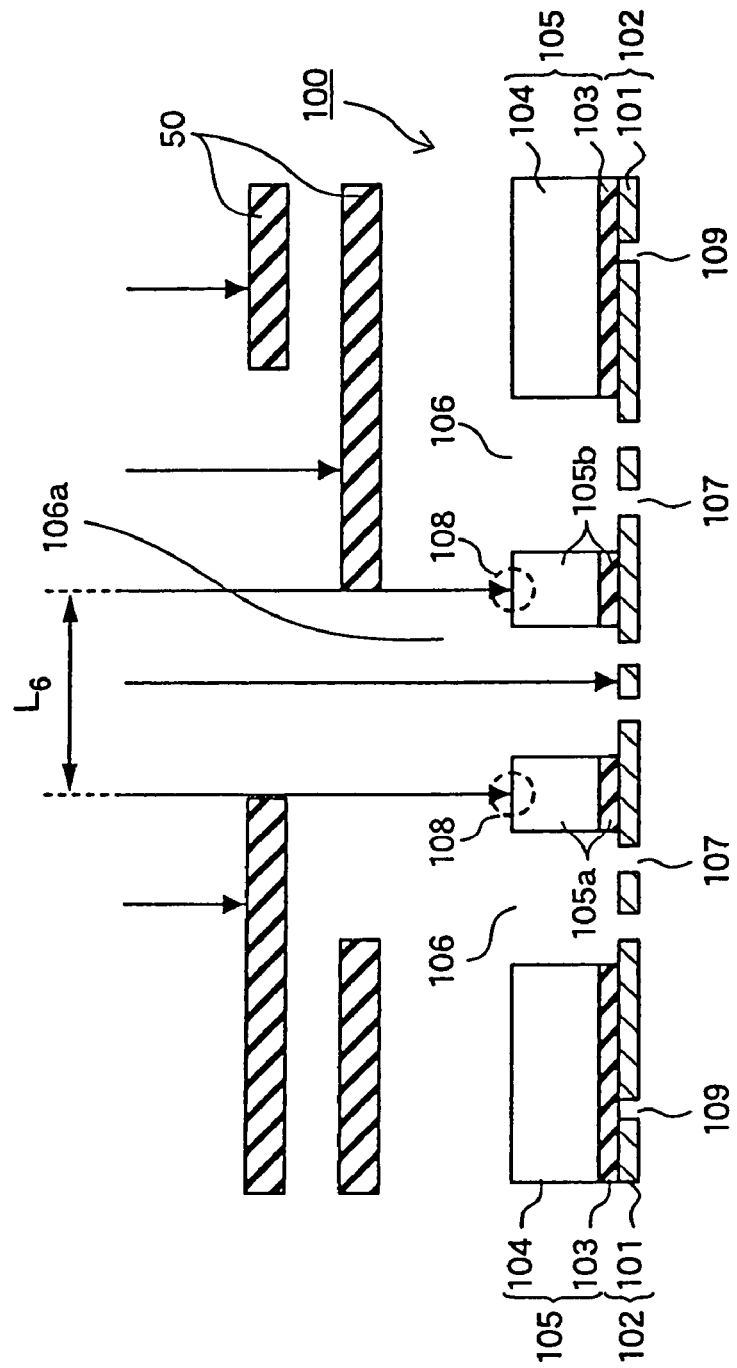
FIG. 12 is a cross-sectional view showing the main portion of the stencil mask in the third embodiment of the present invention.

A pattern-opening 107 of a stencil mask 100 formed in a thin silicon film 101 is located between a first structure portion 105a and support portion 105, a second structure portion 105b and support portion 105, and a first structure portion 105a and a second structure portion 105b, as shown in FIG. 12.

For example, two apertures 50 are installed above stencil mask 100. Apertures 50 restrict irradiated region $L_6$, which covers thin film portion 102 between a first structure portion 105a and a second structure portion 105b. Accordingly, boundary 108 between the damaged region and non-damaged region is not formed on thin film portion 102. That is, all the regions of thin film portion 102 between first beam structure portion 105a and second beam structure portion 105b are irradiated with the particle beam.

The feature of silicon thin film 102 formed between first beam structure portion 105a and second beam structure portion 105b can be changed in a step of fabricating the semiconductor device in consideration of the design of the semiconductor equipment. Adjusting the irradiation region $L_6$ by using a plurality of apertures 50 easily enables to be irradiated uniformly with the particle beam into thin film portion 102.

Moreover, the irradiation region L6 easily enable to be variable by using a plurality of apertures. Consequently, boundary 108 between the damaged region and non-damaged region can be controlled not to be formed on thin film portion 102.

Therefore, degradation such as modification and breakage in thin film portion 102 formed in stencil mask 100 is controlled.

Moreover, a sidewall of first beam structure portion 105a and that of second beam structure portion 105b may be tapered. In this case, boundary 108 may be formed on tapered region of silicon supporting substrate 104.

This modification shows merely an example which two or four beam structure portions are formed in the supporting-substrate opening. A number of beam structure portions are not limited to four pieces. One or more beam structure portions can be formed.

Furthermore, this modification shows an example which boundary 108 between the damaged region and non-damaged region is formed on two beam structure portions, however the formation of the boundary is also not limited on the two beam structure portions. For example, a part of the boundary can be formed on the support portion and another part of the boundary can be formed on the beam structure portion (not illustrated).

Moreover, a beam structure portion formed inside the irradiation region of a particle beam is shown for an example, however a number of the beam structure portions are not limited to one piece.

A fourth embodiment of the invention is hereinafter explained using FIG. 13. The fourth embodiment shows an equipment for fabricating a semiconductor device.

A semiconductor substrate is irradiated with a particle beam through an opening of a stencil mask set above a semiconductor substrate. A charged particle beam such as an electron or ion beam, a neutral particle beam such as an atom, molecule and neutron beam, or an electromagnetic beam such as a photon or x-ray beam is used for the particle beam. However, the particle beam is not restricted to those beams.

Figure 13:
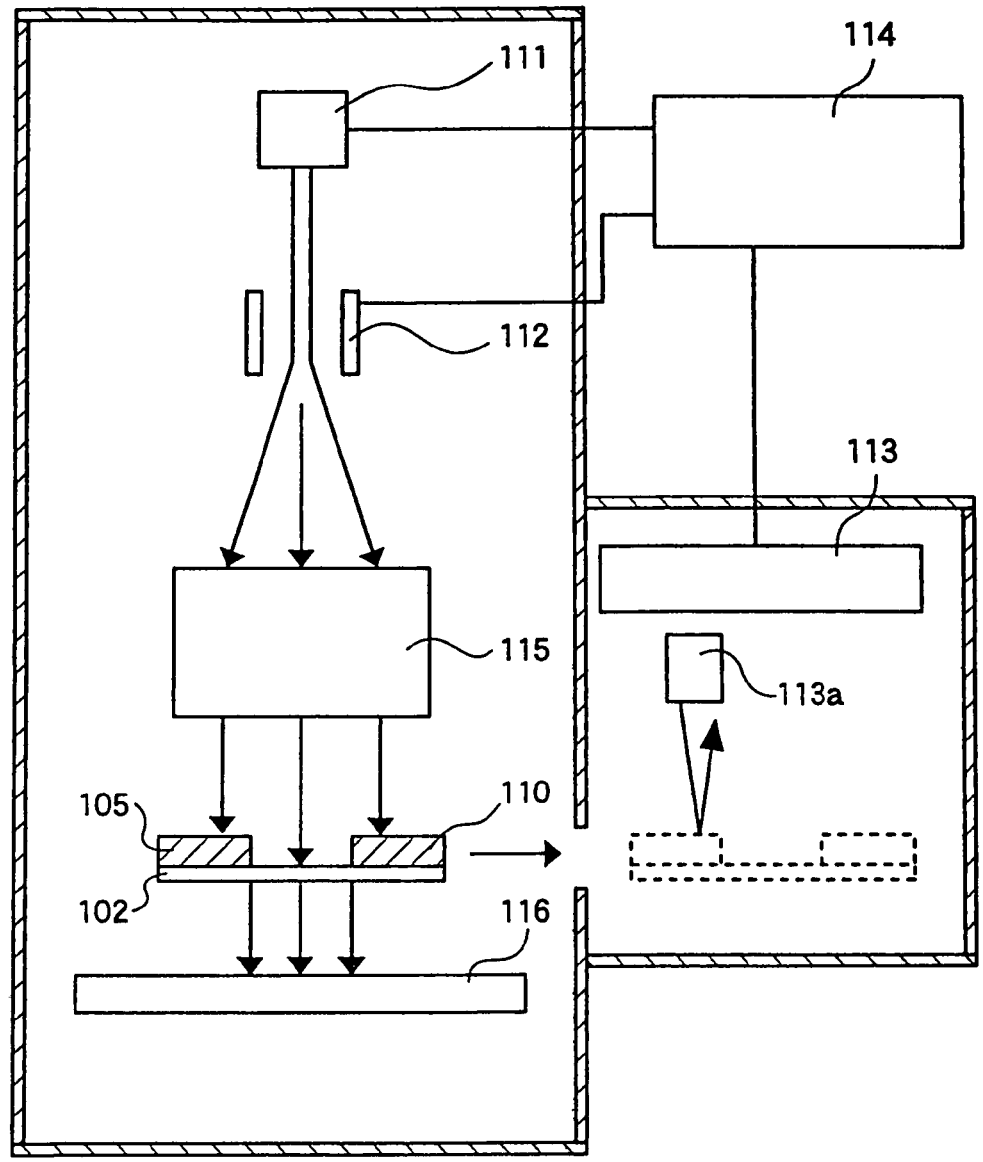
FIG. 13 is a cross-sectional view showing an equipment for fabricating the semiconductor device in a fourth embodiment of the present invention.
Figure 15:
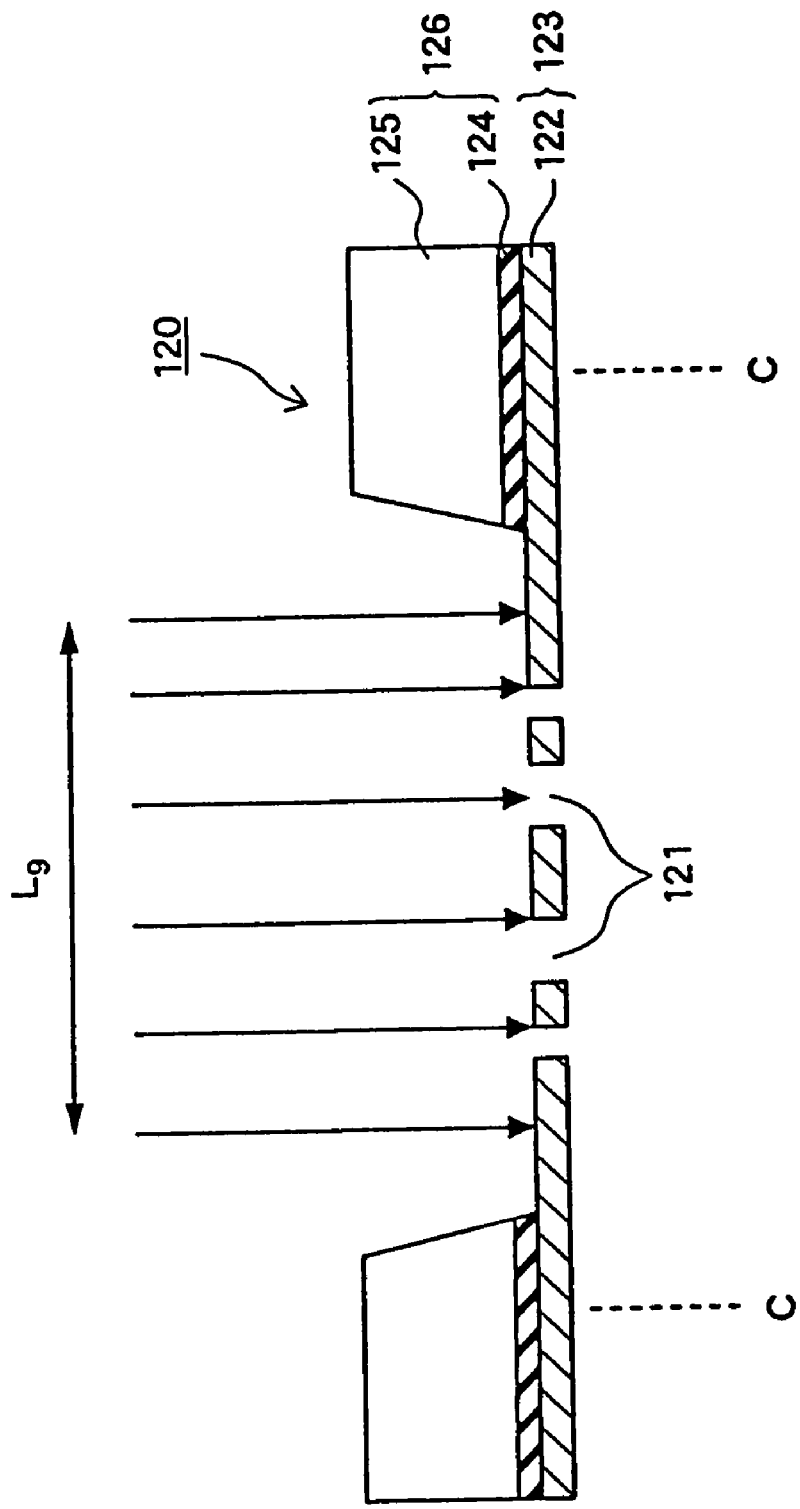
FIG. 15 is a cross-sectional view showing the main portion of a conventional stencil mask.
Figure 16A:
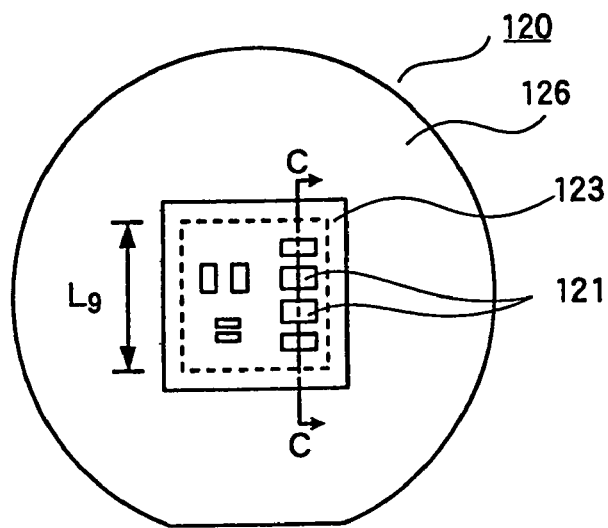
FIGS. 16A to 16C are schematic plane views showing the main portion of the conventional stencil mask.
Figure 16B:
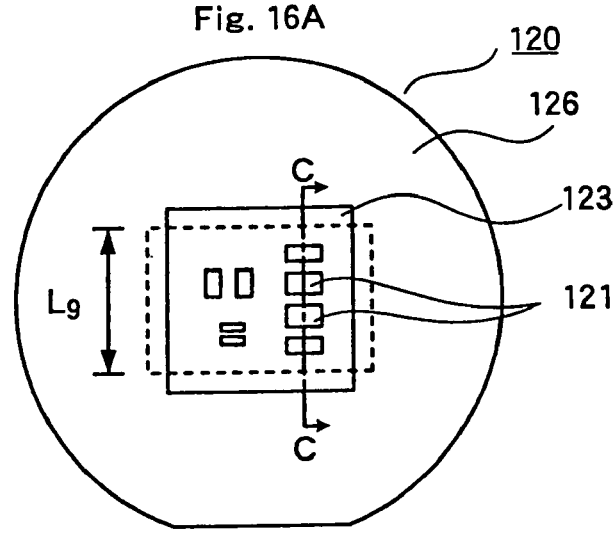
Figure 16C:
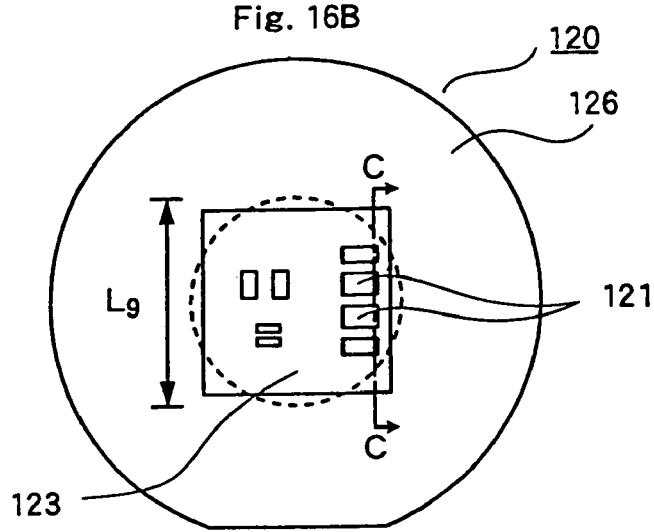
Figure 17:
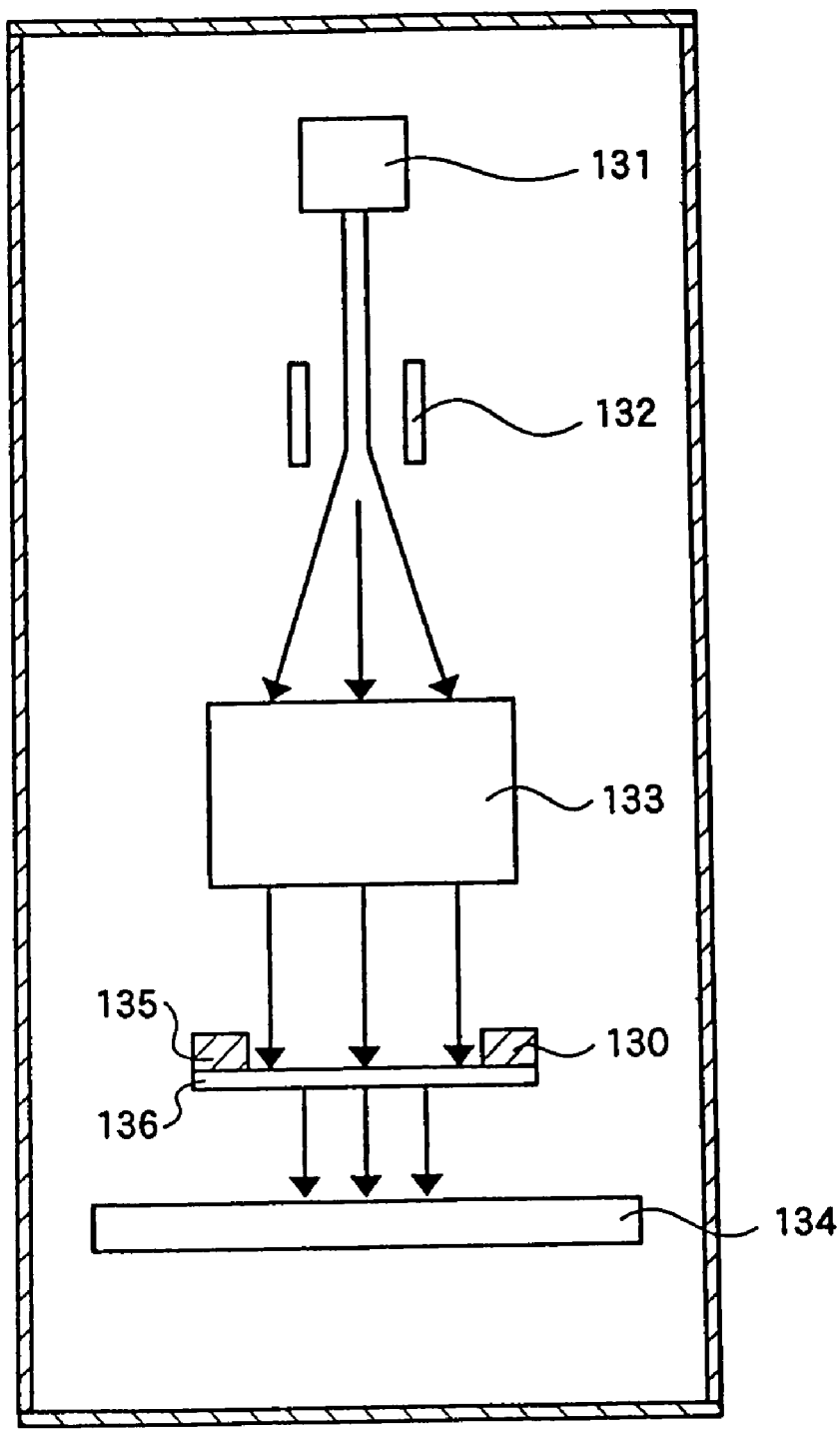
FIG. 17 is a cross-sectional view showing a conventional equipment for fabricating the semiconductor device.
Figure 18A:
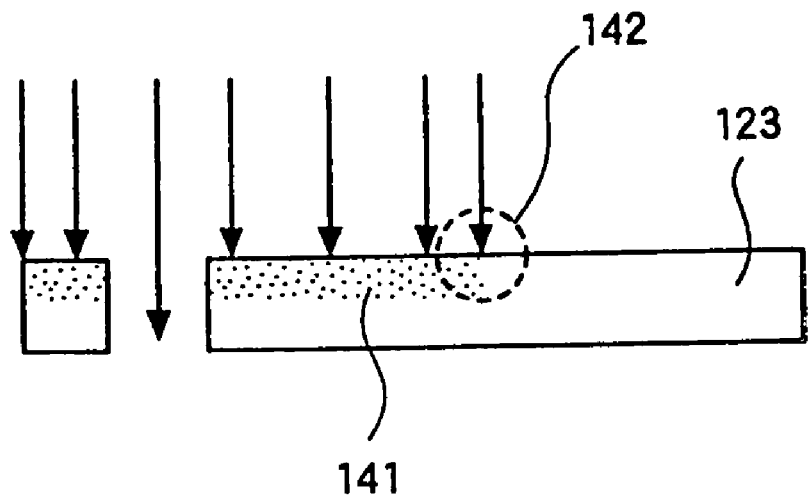
FIGS. 18A to 18c are cross-sectional views showing near a pattern opening in the conventional stencil mask.
Figure 18B:
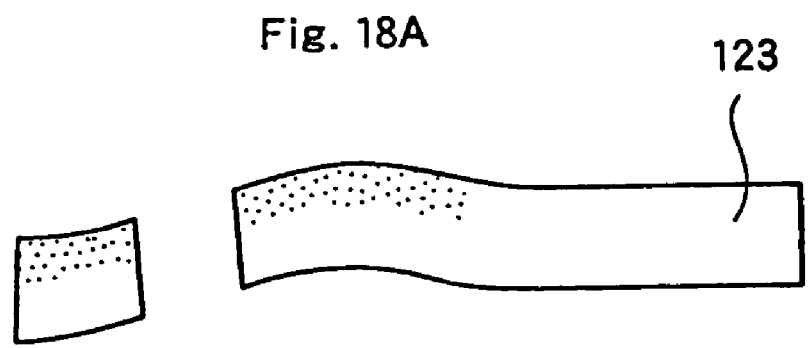
Figure 18C:
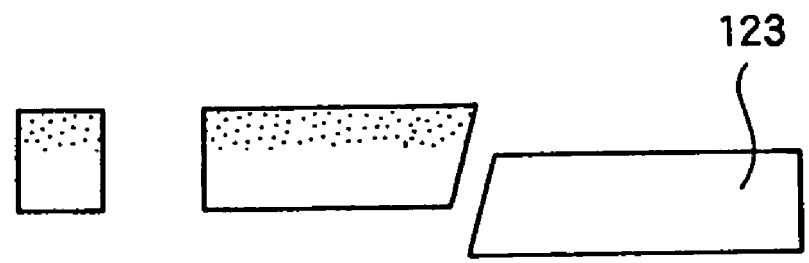

As shown in FIG. 13, a particle beam source 111 irradiates with a charged particle beam, such as an ion beam. An irradiation region is formed using a scanner 112 worked by such as an electrostatic-scan method. In case of using light for the particle beam, an irradiation region is formed using an optical lens and an aperture, etc.

Moreover, in order to measure and judge the feature of a stencil mask 110, such as thickness, a mask measurement device 113 is installed in the equipment. Mask measurement device 113 measures the thickness of stencil mask 110, which moved onto a stage (not illustrated), by a laser displacement instrument etc. Regions of thin film portion 102 and support portion 105 formed a thicker film 102 stencil mask 110 are measured.

The data about features of the region formed thin film portion 102 in stencil mask 110 is fed back to particle beam source 111 and scanner 112 by an arithmetic logic unit 114. Stencil mask 110 is irradiated with the particle beam through scanner 111 and a collimator 115. Stencil mask 110 having predetermined patterns is installed above semiconductor substrate 116 in distance. Semiconductor substrate 116 is irradiated with the particle beam through the pattern opening of stencil mask 110.

A boundary between the irradiated region and the non-irradiated region is formed on supporting portion 105 of stencil mask 110. Thin film portion 102 in supporting portion 105 can be sufficiently covered with the particle beam. Accordingly, a boundary between the damaged region and the non-damaged region is not formed in thin film portion 102.

The fringe of the region introduced with the particle beams is formed on support portion 105 having a thicker film thickness. In case that the stress generates in stencil mask 110, degradation such as modification and breakage in thin film portion 102 formed in stencil mask 110 is controlled.

In consideration that the stress change generated near boundary causes modification and breakage of a stencil mask, it may be still necessary in detail to form the boundary between the irradiation region and the non-irradiation region.

Moreover, a sidewall of the silicon supporting substrate 105 may be tapered (not illustrated). In this case, boundary may be formed on tapered region of silicon supporting portion 105. A stencil mask with a plurality of beam structure portions on a thin film may be used. Predetermined beam structure portions can be formed.

It is desirable that the irradiation region of the particle beam is formed in stencil mask 110. Furthermore, maximization of the particle beam amount in unit time and unit area can be shortened the processing time on the semiconductor substrate.

Moreover, the dose of the particle beam in thin film portion 102 of stencil mask 110 is almost uniform. The dose of the particle beam may be set also uniform in the predetermined depth of thin film portion 102 of stencil mask 110.

As shown in the third embodiment, one or more sheets of apertures may be installed above stencil mask 110. Arithmetic logic unit 114 feeds back the data measured by mask measurement device 113: the data being the region formed thin film portion 111 and formed supporting portion 105 made by thick film.

By installing an aperture, thus indicated, the irradiation region of the particle beam can be formed variable and the irradiation region of the particle beam can be easily controlled irrespective of a specification and a setup of equipment for fabricating semiconductor devices. Although the example shows feeding back the data to an aperture by using arithmetic logic unit 114, feeding back the data is not limited to the case mentioned above. Arithmetic logic unit 114 feeds back the data to one of the aperture, particle beam source 111 and scanner 112.

Mask measurement device 113 is not limited to the device, which has a laser displacement instrument 113a. Mask measurement device 113 using the image recognition may investigate the region formed thin film portion 102 or supporting portion 105 made by thick film in stencil mask 110.

Moreover, it is also possible to form the irradiation region performed numbering and naming corresponding to the feature or classification of a thin film portion 102 and a support portion in stencil mask 110. The feature or classification of a stencil mask recognized by means of such as image recognition may determine the irradiation region in stencil mask 110.

Moreover, it is also possible to input the data to mask measurement device 113. The data are the information about the region of thin film portion 111 and support portion 105. The feature of a stencil mask is recognized by means of an image recognition. The irradiation region in stencil mask 110 can be formed.

This embodiment can be applied to the stencil mask indicated in the first, the second and the third embodiments.

A fifth embodiment of the invention is hereinafter explained utilizing FIGS. 14A and 14B. The fifth embodiment shows a method employing a stencil mask for fabricating semiconductor device.

In fabricating process of semiconductor device, a semiconductor substrate is irradiated with a particle beam through a pattern opening 17 of a stencil mask 10 set above a semiconductor substrate. A charged particle beam such as electron and ion, a neutral particle beam such as atom, molecule and neutron, or an electromagnetic beam such as photon or x-ray is used for the particle beam. However, the particle beam is not only restricted to those beams.

A pattern opening 17 of a stencil mask 10 is arranged right above the ion-implanted region of the semiconductor substrate (not illustrated). The semiconductor substrate is irradiated with ions through pattern opening 17. On the other hand, the non-opening portions in stencil mask 10 shield the non-ion-implantation regions in the semiconductor substrate.

Stencil mask 10 is formed with a thin film portion 12 made of a silicon thin film 11 and a support portion 15 made of a silicon oxide film 13 and a silicon supporting substrate 14. A supporting-substrate opening 16 is formed in support portion 15. Pattern opening 17 of stencil mask 10 formed in silicon thin film 11 is covered with an irradiation region $L_{71}$ of stencil mask 10. A boundary between the irradiated region and the non-irradiated region is formed on silicon thin film 11.

An alignment mark 19 used for fabricating stencil mask 10 is shaped in silicon thin film 11 formed beneath support portion 15.

After an implantation process in fabricating a semiconductor device, in order to control the stress generated on the boundary between irradiated region and the no-irradiated in thin film portion 12 of stencil mask 10, the irradiation region $L_{72}$ in the non-irradiation region is irradiated with the particle beam as shown in FIG. 14B. The stress generated on the boundary between damaged region and non-damaged region is relaxed.

In consideration that the stress change generated near boundary 18 causes modification or breakage of a stencil mask, it may be still necessary in detail to form boundary 18 between the irradiation region and the non-irradiation region.

The process relaxing the stress may perform multiple times in fabricating semiconductor device. Moreover, after ending the process of a lot in fabricating semiconductor device, the process relaxing the stress may carry out before implanting ions into following lot.

The process relaxing the stress is not restricted to irradiating with the particle beam to the non-irradiated region. In case that a particle is an ion, the particle beam introduced into stencil mask 10 may be diffused by thermal annealing. Moreover, chemical processing is performed to the non-irradiated region.

As mentioned above, using a charged particle beam as a particle beam and performing ion implantation process are shown for examples from the first embodiment to the fifth embodiment. On the other hand, using an electron as a particle beam and using a stencil mask in a resist pattern formation process may be performed.

In the resist pattern formation process, the resist is irradiated with an electron beam adjusting the irradiation region. In the final stage of the process, the irradiation region is formed so that the fringe of the irradiation region of an electron beam may not exist in the thin film portion of the stencil mask. When the fringe of the irradiation region of an electron beam exists in the thin film portion of a stencil mask, an additional process relaxing the stress may be carried out so that the boundary between the damage region and the non-damage region may not be generated in the thin film portion of the stencil mask.

Other embodiment of the present invention will be apparent to those skilled in the art from consideration of the specification and practice of the invention disclosed herein. It is intended that the specification and example embodiments be considered as exemplary only, with a true scope and spirit of the invention being indicated by the claims that follow. The invention can be carried out by being variously modified within a range not deviated from the gist of the invention.

What is claimed is:

1. An equipment for fabricating a semiconductor device, comprising:
   a particle beam source generating a particle beam to irradiate a semiconductor substrate with the particle beam through an opening of a stencil mask, the stencil mask having a thin film portion with the opening and a support portion supporting the thin film portion;
   a scanner scanning the particle beam;
   a mask measurement device measuring a position of a thin film portion or a supporting portion; and
   an arithmetic logic unit calculating the data measured by the mask measurement device and feeding back the results calculated with respect to at least one of the particle beam source and the scanner to control the region irradiated by the particle beam.

2. An equipment for fabricating a semiconductor device, comprising:
   a particle beam source generating a particle beam to irradiate a semiconductor substrate with the particle beam through an opening of a stencil mask, the stencil mask having a thin film portion with the opening and a support portion supporting the thin film portion,
   a scanner scanning the particle beam;
   an aperture shielding a part of the particle beam;
   a mask measurement device measuring a position of a thin film portion or a supporting portion;
   an arithmetic logic unit calculating data measured by the mask measurement device and feeding back the data to at least one of the particle beam source, the scanner and the aperture to control the region to be irradiated by the particle beam.

* * * * *